(12) United States Patent
Zidarova et al.

(10) Patent No.: US 12,088,972 B2
(45) Date of Patent: Sep. 10, 2024

(54) CABLE MANAGEMENT SYSTEM

(71) Applicant: Reichle & De-Massari AG, Wetzikon (CH)

(72) Inventors: Nadejda Zidarova, Sofia (BG); Jörg Franzke, Wetzikon (CH); Janusz Derezynski, Sofia (BG); Roger J. Karrer, Kindhausen-Volketswil (CH)

(73) Assignee: Reichle & De-Massari AG, Wetzikon (CH)

( * ) Notice: Subject to any disclaimer, the term of this patent is extended or adjusted under 35 U.S.C. 154(b) by 359 days.

(21) Appl. No.: 17/621,387

(22) PCT Filed: Apr. 23, 2021

(86) PCT No.: PCT/EP2021/060743
§ 371 (c)(1),
(2) Date: Dec. 21, 2021

(87) PCT Pub. No.: WO2021/219518
PCT Pub. Date: Nov. 4, 2021

(65) Prior Publication Data
US 2023/0156378 A1 May 18, 2023

(30) Foreign Application Priority Data
Apr. 28, 2020 (EP) ..................................... 20171912

(51) Int. Cl.
*H04Q 1/06* (2006.01)
*H04Q 1/02* (2006.01)
(Continued)

(52) U.S. Cl.
CPC ................. *H04Q 1/06* (2013.01); *H04Q 1/13* (2013.01); *H05K 5/0247* (2013.01); *H05K 7/10* (2013.01); *H05K 7/1401* (2013.01)

(58) Field of Classification Search
CPC .. H04Q 1/06; H04Q 1/13; H04Q 1/09; H04Q 1/142; H04Q 2201/02; H04Q 1/023;
(Continued)

(56) References Cited

U.S. PATENT DOCUMENTS 7,367,850 B1 * 5/2008 Chang .................... H04Q 1/116
                                                      439/540.1
7,909,643 B2 * 3/2011 Pepe .................... H01R 13/514
                                                      439/540.1
(Continued)

FOREIGN PATENT DOCUMENTS

EP          2993912 A2    9/2016
KR     20080093804 A    10/2008

OTHER PUBLICATIONS

European Search Report dated Oct. 20, 2020 issued in corresponding EP Patent Application No. EP 20171912.7.
(Continued)

*Primary Examiner* — Michael A Matey
(74) *Attorney, Agent, or Firm* — Posz Law Group, PLC

(57) ABSTRACT

A cable management system has: a cable management unit which has a casing unit defining at least one receiving space for receiving a cassette; and has the cassette which has a front socket section, wherein the casing unit comprises a grounding element that is configured for mechanically contacting and electrically grounding the front socket section in a mounted state of the cassette.

20 Claims, 8 Drawing Sheets

Figure 1:
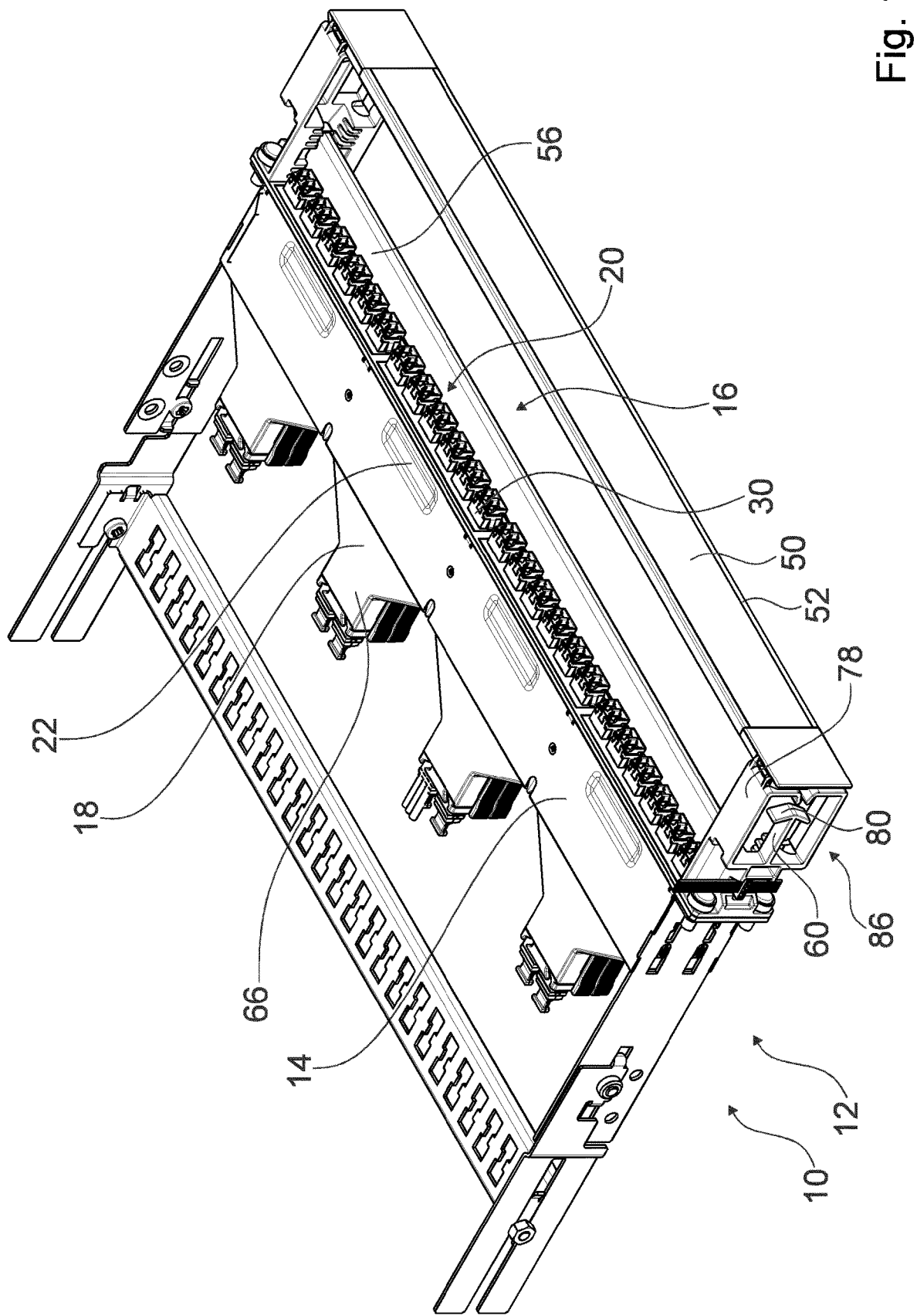

(51) Int. Cl.
*H05K 5/02* (2006.01)
*H05K 7/10* (2006.01)
*H05K 7/14* (2006.01)

(58) Field of Classification Search
CPC ........ H04Q 1/066; H04Q 1/068; H04Q 1/116; H04Q 1/021; H04Q 1/025; H04Q 1/062; H04Q 1/064; H04Q 1/08; H04Q 1/136; H04Q 1/14; H04Q 2201/10; H04Q 2201/14; G02B 6/4452; G02B 6/3897; G02B 6/4453; G02B 6/44526; G02B 6/44528; G02B 6/4455; G02B 6/3825; H01R 13/518; H01R 9/2416; H01R 43/01; H01R 4/245; H01R 35/04; H01R 13/74; H01R 13/6596; H01R 13/6583; H01R 13/506; H05K 7/14; H05K 7/1401; H05K 5/0204; H05K 5/0217; H05K 7/10; H05K 5/0247; H02G 1/00; Y10S 439/939; Y10T 29/49002; Y10T 29/49208; Y10T 29/49826
See application file for complete search history.

(56) References Cited

U.S. PATENT DOCUMENTS

| | | | |
|---|---|---|---|
| 8,241,055 B2 * | 8/2012 | Chen | H01R 13/743 439/540.1 |
| 2004/0209515 A1 * | 10/2004 | Caveney | H01R 13/518 439/540.1 |
| 2005/0191901 A1 * | 9/2005 | Follingstad | H01R 13/518 439/534 |
| 2005/0265013 A1 * | 12/2005 | Keith | H04Q 1/023 361/826 |
| 2008/0090461 A1 * | 4/2008 | Pepe | H01R 13/6583 439/649 |
| 2009/0075516 A1 * | 3/2009 | Pepe | H04Q 1/136 439/490 |
| 2009/0097813 A1 * | 4/2009 | Hill | G02B 6/4454 385/135 |
| 2010/0142910 A1 * | 6/2010 | Hill | G02B 6/4454 385/135 |
| 2010/0221954 A1 | 9/2010 | Pepe et al. | |
| 2011/0228473 A1 * | 9/2011 | Anderson | H05K 7/1401 361/679.02 |
| 2013/0090005 A1 * | 4/2013 | Nesme | H04Q 1/14 439/574 |
| 2016/0080836 A1 * | 3/2016 | Carreras Garcia | H01R 24/62 439/638 |
| 2017/0082815 A1 * | 3/2017 | Takeuchi | G02B 6/4452 |

OTHER PUBLICATIONS

International Search Report dated Jul. 28, 2021 issued in corresponding International Patent Application No. PCT/EP2021/060743.

* cited by examiner

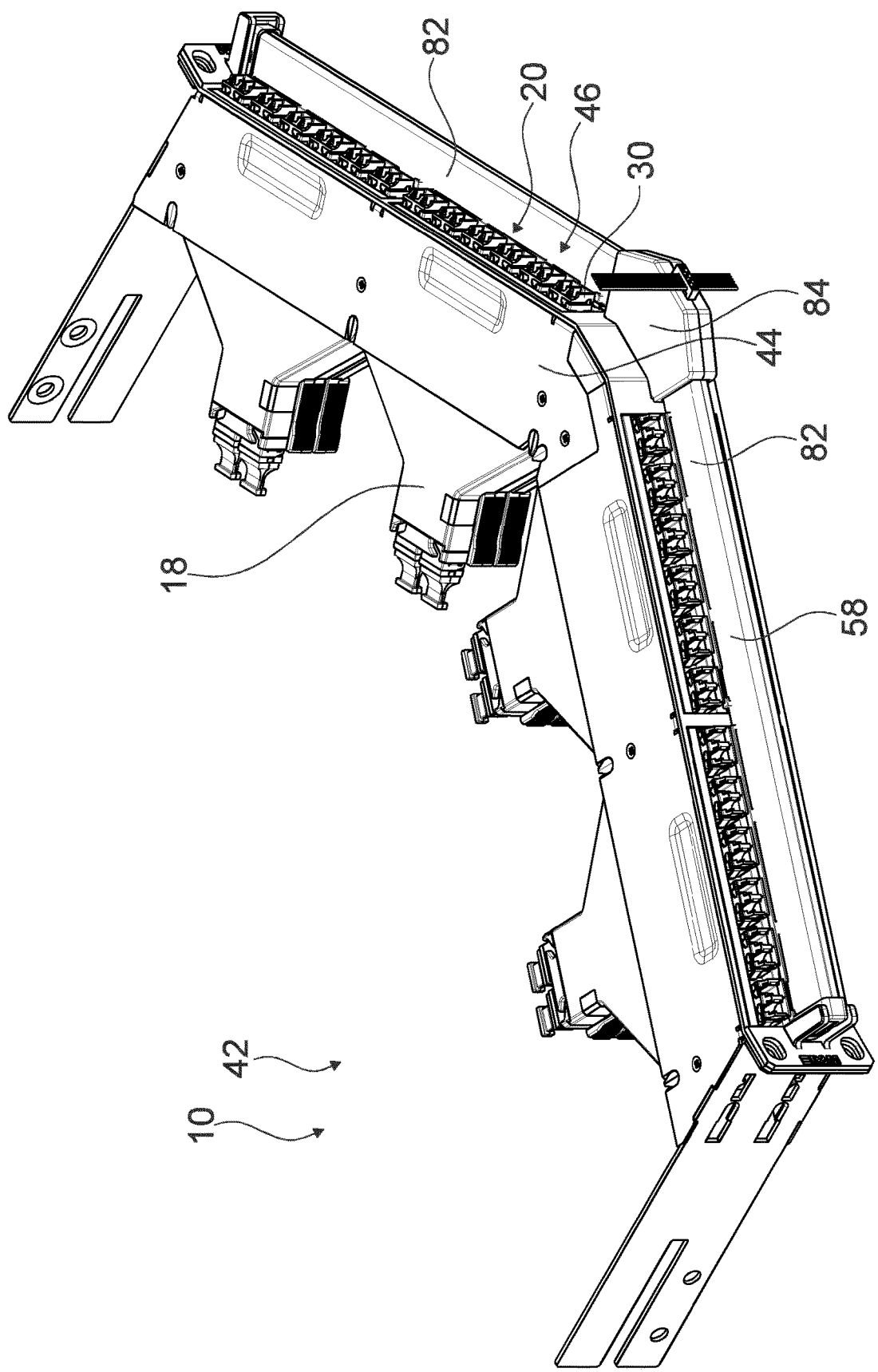

CABLE MANAGEMENT SYSTEM

CROSS REFERENCE TO RELATED APPLICATIONS

This application is a U.S. national stage application of PCT/EP2021/060743 filed on Apr. 23, 2021 which is based on European Patent Application No. 20171912.7 filed on Apr. 28, 2020, the contents of which are incorporated herein by reference.

STATE OF THE ART

The invention relates to a cable management system according to the preamble of claim 1.

From the state of the art cable management systems with patch panels for receiving cassettes, in particular splice cassettes, for a managing of cables, in particular patch cables, in particular for optical waveguide cables, are known. Such patch panels are configured for connecting to a rack, in particular a 19-inch standard rack.

The objective of the invention is, in particular, to provide a cable management system with improved characteristics regarding flexibility, ease of handling and construction. The objective is achieved, according to the invention, by the features of claims 1, 5 and 10, while advantageous implementations and further developments of the invention may be gathered from the dependent claims.

Advantages of the Invention

The invention relates to a cable management system, comprising a cable management unit, in particular a patch panel, which has a casing unit defining at least one receiving space for receiving a cassette, in particular a splice cassette, in particular in a receiving direction; and comprising the cassette which has a front socket section.

In one aspect of the invention, which may in particular be considered in combination with as well as separately from other aspects of the invention, it is proposed that the casing unit comprises a grounding element that is configured for mechanically contacting and electrically grounding the front socket section in a mounted state of the cassette, wherein in this aspect of the invention the cassette is preferably configured to manage electrical connections.

By means of the invention in particular an enhanced ease of handling can be achieved. Advantageously, a grounding of plugs plugged into the front section can be achieved in an easy fashion.

Preferably, the cable management system is embodied as a modular construction system, which comprises a certain number of elements to build, preferably in a modular way, a unit or device which is configured to execute at least one function in at least one operational state.

The cable management unit is advantageously, in at least one operational state, configured for managing, in particular guiding, connecting, coupling, terminating and/or distributing, cables, in particular patch cables, in particular a plurality of cables, in particular a plurality of patch cables, preferably optical waveguide cables and/or electrical cables. Advantageously, the casing unit can be fastened to a carrier unit of the cable management system, in particular a rack. The receiving space may comprise at least one opening for receiving the cassette. The receiving space may advantageously comprise a plurality of openings, which may be identical or different from each other. In particular, each of the openings is configured to receive a single cassette. Preferably, the openings are arranged in matrix form.

Favorably, each of the cassettes received in the casing unit is individually movable, in particular with respect to any other cassette and in particular with respect to the casing unit, from at least one coupled position to at least one decoupled position. In particular, in the mounted state of the cassette, the cassette is in the coupled position.

Moreover, the cable management unit could be embodied as an ETSI insert and preferably as a 19-inch insert for connecting to an, in particular standard, ETSI rack and preferably to a 19-inch rack. It could also be feasible that the cable management unit may be embodied as any different type of insert for connecting to any different type of rack. Preferably, the cable management unit has a height of 1 height unit. Possibly, the cable management unit could have a different height, for example up to 5 height units. The cable management unit could be embodied as a patch panel with any number of ports. However, it is proposed that the cable management unit is advantageously embodied as a 48-port patch panel and is configured to support up to 48 plug connections; in particular the casing unit defines at least one receiving space for receiving up to eight cassettes, wherein each of the cassettes may comprise a front socket section with up to six sockets. Advantageously, each of the sockets is configured for receiving one simplex plug or duplex plug.

Furthermore, the cassette is preferably embodied as an, in particular detachably mounted, unit which is located in a coupled position, in particular in the receiving space, and which is preferably configured for providing and/or supporting a connection functionality and/or a connection capability. Herein, the cassette is preferably configured for guiding, connecting, coupling, terminating and/or distributing at least one cable. Particularly preferably, the cable management unit comprises a plurality, in particular up to eight, cassettes, which are preferably releasable from, connectable to and/or replaceable by each other individually and which can be, at least to a large extent, embodied at least substantially identical to each other. In addition, the cable management unit may be configured to receive up to eight cassettes arranged in a 2×4 matrix. The cassette has in particular a modular structure and is preferably movable from at least one coupled position to at least one decoupled position and vice versa, preferably in a linear motion. The cassette itself and/or at least one structural component of the cassette has a modular structure and/or is implemented in such a way that it can be assembled modularly, for example like in a construction kit. In particular, herein at least one structural component of the cassette can be replaced by at least one further structural component. Particularly preferably, the cassette is herein extendable and/or reducible in any required way.

The coupled position may be a mechanically defined position of the cassette, in particular with respect to the casing unit, in which a normal operation, in particular a connecting and/or removing from plugs to and/or from the front socket section, takes place and/or in which a processing, e.g. a maintenance, a new cabling, a patching and/or a splicing, is limited to a large extent. In particular, in the coupled position the cassette is at least largely and preferably completely located in the receiving space of the cable management unit and/or at least largely and preferably completely inserted into the cable management unit. The decoupled position may be a mechanically defined position of the cassette, in particular with respect to the casing unit, in which a processing operation, e.g. a maintenance operation, a cabling operation, a patching operation and/or a splicing operation, is possible. In particular, in the decoupled position the cassette may be partially or entirely removed from the receiving space of the cable management unit and/or the cable management unit.

Advantageously, the cable management system comprises a plurality of cable management units, which are preferably releasable from, connectable to and/or replaceable by each other individually and which are embodied particularly preferably to be at least substantially identical to each other. Herein, the cable management units are preferably located adjacently to each other and particularly preferably one above the other one, in particular with respect to a height of the cable management unit. The phrasing "at least substantially identical objects" is to mean, in this context, objects which advantageously have the same structure but may at least partially differ in particular as regards their functionality, their inner structure, and/or their dimensions. However, preferably the at least substantially identical objects are identical aside from manufacturing tolerances and/or within the range of standardized tolerances. One "height unit" herein corresponds in particular to one rack unit (U) and/or 44.45 mm.

The grounding element is advantageously configured for mechanically contacting and electrically grounding each socket of the front socket section. For example, the grounding element could be embodied as an element that is separate from a remaining portion of the casing unit and mounted on the remaining portion of the casing unit, for example via a screw connection and/or snap connection and/or plug connection. Preferably, the grounding element and the remaining portion of the casing unit are embodied in a one-piece implementation. For example, the grounding element and the remaining portion of the casing unit could be connected via a welding connection and/or an adhesive connection. It could be feasible that the grounding element is embodied as a flat subarea of the casing unit. Advantageously, the grounding element is embodied as a part of the casing unit which is free from any kind of coating of the remaining portion of the casing unit, for example paint and/or varnish.

"Configured" is to mean specifically designed and/or equipped. By an object being configured for a certain function, it is to be understood that the object fulfills and/or implements this certain function in at least one application state and/or operating state.

It is possible that the grounding element could be embodied as a protrusion of the casing unit, for example a lug welded or glued on a surface of the casing unit. In order to simplify a grounding of the front socket section, it is proposed that the grounding element is embodied as a deepening of the casing unit, in particular into the receiving space. For example, the grounding element could be embodied as a square or circular deepening. Preferably, the grounding element is embodied as a rectangular deepening, the longest side of which runs orthogonally to the receiving direction. In particular, an extent by which the deepening extends into the receiving space is at least 50% and preferably at least 75% of a thickness of the casing unit. In this way a distance between the front socket section and the grounding element can be reduced without the need for additional components.

Furthermore it is proposed that the casing unit comprises a further grounding element, in particular a further deepening, which is arranged opposite the grounding element and is configured for mechanically contacting and electrically grounding a further cassette, wherein the further cassette is preferably configured for managing electrical connections. In particular, the grounding element and the further grounding element are arranged on opposite walls of the casing unit. Preferably, the casing unit comprises a plurality of grounding elements, which may advantageously be identical to each other and arranged in opposite-situated pairs. Particularly preferably, the casing unit comprises one grounding element for each cassette which may be received in the receiving space. The further grounding element could be embodied differently than the grounding element; advantageously, the further grounding element is embodied identically to the grounding element. Further advantageously, each of the grounding elements is centered relative to its assigned cassette in a mounted state of the cassettes. In this way, the grounding of a plurality of front socket sections may be simplified. Advantageously, each cassette is assigned a nearby-situated grounding element, thus minimizing a distance between each of the grounding elements and its assigned sockets.

Possibly, the grounding element could contact the front socket section directly. In order to further simplify a grounding of the front socket section, it is proposed that the cassette and/or the further cassette comprises a contact element that is configured for mechanically and electrically connecting the grounding element with each socket of the front socket section in the mounted state of the cassette. Preferably, cassettes configured for managing optical connections are free of contact elements. The contact element is configured to connect each socket of the front socket section with the grounding element in the mounted state of the cassette. Advantageously, the contact element comprises a base which is configured to be connected with the sockets of the front socket section in the mounted state of the cassette and a contact which is configured to be directly connected to the grounding element in the mounted state of the cassette. It could be feasible that the contact is fixed to the grounding element in the mounted state of the cassette, for example by means of a screw connection and/or plug connection and/or snap connection. Preferably, the contact is pressed against the grounding element in the mounted state of the cassette. The contact may be a rigid contact, for example a sliding contact, advantageously, the contact is a spring contact. The contact element may comprise any number of contacts. The contact element may comprise a wire, preferably the contact element comprises a bent metal sheet, and particularly preferably the contact element is embodied as a single bent metal sheet. Advantageously, the sockets of the front socket section can be connected to the grounding element in a cheap and easy fashion.

In another aspect of the invention, which may in particular be considered in combination with as well as separately from other aspects of the invention, it is proposed that the cassette and/or the further cassette comprises a coupling element, which has a grip section for gripping the cassette, in particular at a rear of the cassette, and a latching section for coupling the cassette to the cable management unit, wherein the coupling element is embodied in a one-piece implementation, it could for example be feasible that the coupling element is made of metal and formed in one piece. Furthermore, the coupling element may be connected to a remaining portion of the cassette in any feasible manner, for example by means of a plug connection and/or a screw connection and preferably a snap connection. Preferably, the grip section comprises a first gripping part and a second gripping part, which particularly preferably encompass two opposing sides of the rear of the cassette, thus allowing for a tight, pincerlike grip. Advantageously, the gripping parts each comprise a ribbed surface. The latching section may comprise a latch tongue and/or a latch hole which corresponds to a latch hole and/or latch tongue of the cable management unit. In this way, the coupling element may be embodied in a cheap and easy to produce fashion. Advantageously, additional steps in order to assemble the coupling element are not necessary.

In order to further simplify a construction of the coupling element, it is proposed that the coupling element is made of plastic and is in particular injection-molded. In this way, a plurality of coupling elements can be produced using a single mold which is easily adaptable in order to allow a flexible design of the coupling element.

The latching section may be actuated for a decoupling of the coupling element from the cable management unit via a decoupling section of the coupling element which differs from the latching section and the grip section. Alternatively, the latching section may be actuated directly for decoupling the coupling element from the cable management unit. In order to enhance an ease of handling, it is proposed that the latching section can be actuated, in particular for decoupling of the coupling element from the cable management unit, via the grip section. It is possible that the latching section may be actuated via the grip section and additionally in any other feasible manner. Preferably, the grip section is configured for a coupled movement with the latching section. Feasibly, the grip section could be pushed or pulled in order to actuate the latching section. Advantageously, the grip section is twisted in order to actuate the latching section. Particularly advantageously, the gripping parts of the grip section each have a plate-like shape and can be bent to one side, in particular by exclusively pushing a top of the gripping part, in order to actuate the latching section. A plate-like element is to be understood as an element having a thickness which is at most 15% and preferably at most 10% of a width and length of the element. Words indicating a side or direction like "top", "bottom", "side", "front", "rear" each are defined in relation to a view of a user in an imaginary working state of the cable management system in which the user handles cables leading to the front socket section and looks directly at the front socket section. In this way, the latching section can be actuated from the rear of the cassette, without the need to reach for the latching section itself.

Particularly preferably, the coupling element comprises a spring section for coupling the coupling element to a remaining portion of the cassette, wherein the cassette comprises a receiving section for partially receiving the spring section in a rest position of the spring section. In particular, the spring section is configured to be movable from the rest position to a tensioned position and vice versa. The spring section could for example have a helical shape, preferably the spring section has a flat meandering shape. In particular, coupling the coupling element to the remaining portion of the cassette comprises a moving of the spring section into the tensioned position followed by an arranging of the coupling element in a mounting position relative to the remaining portion of the cassette and a release of the spring section. In particular, the latching section is coupled to the remaining portion of the cassette via a corresponding latch hole and/or latch tongue of the remaining portion of the cassette in the mounting position. Advantageously, the spring section may be moved back into the tensioned position and/or the latching section may be decoupled from the remaining portion of the cassette for a decoupling of the coupling element from the remaining portion of the cassette. In this way, a fast and easy coupling and/or decoupling of the coupling element to the cassette may be achieved.

In another aspect of the invention, which may in particular be considered in combination with as well as separately from other aspects of the invention, it is proposed that the cable management system comprises a further cable management unit, in particular a further ETSI-insert or 19-inch insert, which has a further casing unit defining at least one further receiving space for receiving the cassette, wherein the cable management unit has a straight shape, the further cable management unit has an angled shape, and the cassette has a rear socket section. The cable management system may comprise any number of cable management units and/or further cable management units. In particular, the further cable management unit comprises at least two cable management elements, preferably of equal size, which are arranged at an angle. Advantageously, the cable management elements are arranged in a V-shape. Further advantageously, the cassette is shaped in such a way that the cable management unit and the further cable management unit can each receive the maximum number of cassettes able to fit into their receiving spaces. In this way, an enhanced flexibility can be achieved. Advantageously, the same type of cassette can be used both in angled and in straight inserts.

Furthermore, it is proposed that the front socket section is wider than the rear socket section. The front socket section being "wider" than the rear socket section is to mean that in the mounted state of the cassette, an extension of the front socket section orthogonally to the receiving direction is by at least 10%, preferably at least 20% and advantageously at least 30% greater than an extension of the rear socket section orthogonally to the receiving direction. Preferably, the front socket section comprises more sockets than the rear socket section. Particularly preferably, the rear socket section comprises two sockets. It could be possible that a case of the cassette has a rectangular shape in an orthogonal view relative to a main extension plane of the case of the cassette, preferably, the case of the cassette tapers towards the rear socket section. By a "main extension plane" of an object a plane is to be understood which is oriented parallel to a largest side surface of a smallest imaginary rectangular cuboid which just still completely encloses the object, and in particular runs through the center of the rectangular cuboid. The case of the cassette could be bent inwardly towards the rear socket section, preferably the case of the cassette comprises in the orthogonal view a slanted section connecting two straight sections, where the straight sections lead to the front socket section and the rear socket section respectively. In this way, while using an angled cable management unit, two cassettes can be arranged next to each other on different cable management elements of the angled cable management unit without rears of the cassettes blocking each other.

Additionally, it is proposed that the cable management system comprises a door for shielding the front socket section, for example against frontal impacts and/or accidental unplugging of plugs plugged into the front socket section, wherein the door comprises a reinforcement element that is configured for preventing a bending of the door due to a weight and/or a rigidity of cables leading to the front socket section in a working state. Additionally, the door could be used for a labeling of the front socket section. Preferably, the door comprises an extension orthogonally to the receiving direction in a mounted state, which covers a large portion of and particularly preferably the entire cable management unit. In particular, the door is distanced from the cable management unit via two arms located on opposite sides of the cable management unit orthogonally to the receiving direction in which the cable management unit is mounted. Advantageously, the door is movably coupled to the arms, particularly advantageously, the arms define a swivel range along which the door is movable in order to access the front socket section. Preferably the door is embodied as an elongate plate held between both arms. The reinforcement element may be embodied as a contour element of the door, for example as a stiffening rib and/or as a deepening. Preferably, the reinforcement element is embodied as a reinforcement rod or, particularly preferably, as a reinforcement plate. Advantageously, the reinforcement element comprises a part of a frame of the door or the entire frame of the door. The reinforcement element may comprise a plastic material, advantageously the reinforcement element comprises a metal, for example aluminum, and particularly advantageously the reinforcement element is made of metal. In this way, a door can be provided which can be used to shield a front socket section of cassettes regardless of whether the cassettes are configured for managing optical connections or electrical connections.

It could be possible that the cable management system comprises a further cassette, wherein the receiving space is configured for receiving the cassette and the further cassette next to each other or on top of each other in the same orientation. In order to enhance an ease of handling and to simplify a construction of the cable management unit, it is proposed that the cable management system comprises a further cassette with a further front socket section, wherein the receiving space is configured for receiving the cassette and the further cassette in an upside-down orientation relative to each other. Preferably, a top of the cassette and a bottom of the further cassette or vice versa face each other in a mounted state of the cassette and the further cassette. In this way, the grip sections of the coupling elements of the cassette and the further cassette can be arranged close to each other, simplifying a demounting of both cassettes. Advantageously, a simple symmetrical design of the cable management unit can be achieved.

In addition, it is proposed that the cassette and the further cassette may each be configured for managing electrical and/or optical connections, wherein the cassette and the further cassette are interchangeably mountable to the cable management unit and/or the further cable management unit. In this way, a cable management system can be provided which is freely adaptable in terms of whether optical waveguide cables and/or electrical cables need to be managed by the cable management system. Advantageously, a usage of multiple cable management systems for a management either of optical waveguide cables or of electrical cables can be avoided.

Advantageously, the cable management system comprises an identification bar located in a vicinity of the receiving space and is configured for identifying plugs plugged into the front socket section and/or the further front socket section in a working state. The identification bar "identifying" plugs plugged into the front socket section and/or the further front socket section is to mean that the identification bar is able to detect a presence of a plug at each socket of the front socket section and/or of the further front socket section, thus determining whether the plug is plugged in. For example, the identification bar could comprise a light source unit and a light detector unit, wherein the light source unit emits light beams towards each socket and the light detector unit determines if any of the light beams are interrupted by a plug. Alternatively, the identification bar could comprise an imaging unit for capturing and analyzing an image of the front socket section and/or further front socket section in order to detect the presence of plugs. Preferably, the identification bar comprises a transmitter unit and/or a receiver unit, configured to communicate with corresponding transmitter units and/or receiver units which are arranged at each of the plugs, for example via radio signals and/or infrared signals and/or Bluetooth signals and particularly preferably via RFID signals. The identification bar may additionally be configured to identify a device which the plugs plugged into the front socket section and/or the further front socket section are assigned to. It may also be possible that the identification bar comprises a communication unit that is configured to communicate with an external unit, for example a computer and/or smartphone, in order to transfer identification data of the plugs to the external unit. The identification bar being located in a "vicinity" of the receiving space is to mean that the identification bar is located above and/or below and/or next to an opening of the receiving space, preferably the distance between the identification bar and the receiving space is less than 20 mm and particularly preferably less than 10 mm. In this way an advantageous control and/or monitoring of a connection state can be achieved and as a result in particular an improved maintainability and/or a connection or patching process may be accomplished.

Preferably, the identification bar is located in a plane between the cassette and the further cassette, in particular between two openings of the receiving space, in at least one working state. In this way, an efficient usage of installation space can be achieved.

It could be feasible that the identification bar is fixed to the cable management unit, for example by way of an adhesive connection. In order to enhance a flexibility of the identification bar, it is proposed that the identification bar is detachable from the cable management unit and/or the further cable management unit. The identification bar may be mountable to the cable management unit and/or the further cable management unit by means of a screw connection and/or a slide connection and/or a plug connection. Preferably, the identification bar can be clipped onto the cable management unit and/or the further cable management unit. In this way, the same identification bar can be used for different cable management units. Advantageously, a broken identification bar can be replaced by a new identification bar or the identification can be substituted by a different type of identification bar in an easy fashion.

Moreover, it is proposed that the cable management system comprises a labeling bar for a labeling of the front socket section and/or of the further front socket section, wherein the identification bar and the labeling bar are interchangeably mountable to the cable management unit and/or to the further cable management unit. The labeling bar preferably comprises a writing space and/or a display for displaying a label of the front socket section and/or of the further front socket section. The label may be created by hand, for example with a pen, or digitally, and it could be feasible that the labelling bar comprises a touchscreen configured to display a label written by a touchpen. The label may for example indicate a number assigned to the front socket section and/or further front socket section. The labeling bar may be mountable to the cable management unit and/or the further cable management unit by means of a screw connection and/or a slide connection and/or a plug connection. Preferably, the labeling bar can be clipped onto the cable management unit and/or the further cable management unit. The labeling bar could differ in shape from the identification bar, advantageously the labeling bar and the identification bar have the same shape apart from tolerances in production. In this way, a flexibility can be further enhanced. Advantageously, additional space for a mounting of the labeling bar is not needed.

In case the angled further cable management unit is used, the identification bar and/or the labeling bar preferably consist/consists of two separate identification elements and/or labeling elements, which preferably have a bar shape, particularly preferably of the same length and are respectively assigned to a cable management element of the further cable management unit, and which are connected via a middle piece holding the two identification elements and/or labeling elements at an angle to each other which is identical to the angle between the cable management elements of the further cable management unit. The middle piece may also be detachable from the further cable management unit.

Possibly, the cable management system could comprise a further identification bar for identifying plugs plugged into the further front socket section. In order to simplify an identification of plugs plugged into the front socket section and the further front socket section, the identification bar comprises sensor elements which are positioned on a top and a bottom of the identification bar, in particular for identifying plugs plugged into the front socket section and for identifying further plugs plugged into the further front socket section, respectively. In this way, an identification of plugs plugged into the front socket section and the further front socket section can be achieved with a single identification bar in an easy fashion.

Finally, it is proposed that the cable management system comprises a front cable manager for managing cables leading to the front socket section, comprising a cable holding element for a holding of cables leading to the front socket section. A "holding" of cables is to be understood as a prevention of movement of the cables in a predefined position of the cables relative to the cable holding element. It could be feasible that the cable holding element comprises a cable guiding channel that is configured to receive the cables. Preferably, the cable holding element comprises a tine for catching the cables. The tine may be hookshaped, preferably the tine is straight and particularly preferably angled. Advantageously, the cable holding element comprises a plurality of tines, which may differ from each other or be identical to each other. Particularly advantageously, the cable holding element may have an arrow shape with two angled tines projecting from a base of the cable holding element, wherein preferably each of the tines is configured to catch cables leading to a respective row of front socket sections. The cable holding element may be embodied as a separate element mounted on the cable management unit. Preferably, the front cable manager comprises the arms holding the door, wherein the cable holding element is embodied as a portion of the arms holding the door. Particularly preferably, each of the arms holding the door comprises one cable holding element. In this way, a fast and easy bundling and separating of cables leading to the front socket section and/or further front socket section can be achieved. Advantageously, an unplugging of the plugs is not required for bundling and separating the cables.

Herein the cable management system is not to be limited to the application and implementation described above. In particular, for the purpose of fulfilling a functionality herein described, the cable management system may comprise a number of respective elements, structural components and units that differs from the number mentioned herein. Furthermore, regarding the value ranges mentioned in this disclosure, values within the limits mentioned are to be understood to be also disclosed and to be used as applicable.

DRAWINGS

Further advantages may become apparent from the following description of the drawings. In the drawings an exemplary embodiment of the invention is shown. The drawings, the description and the claims contain a plurality of features in combination. Someone having ordinary skill in the art will purposefully also consider the features separately and will find further expedient combinations.

If there is more than one specimen of a certain object, only one of these is given a reference numeral in the figures and in the description. The description of this specimen may be correspondingly transferred to the other specimens of the object.

Figure 2:
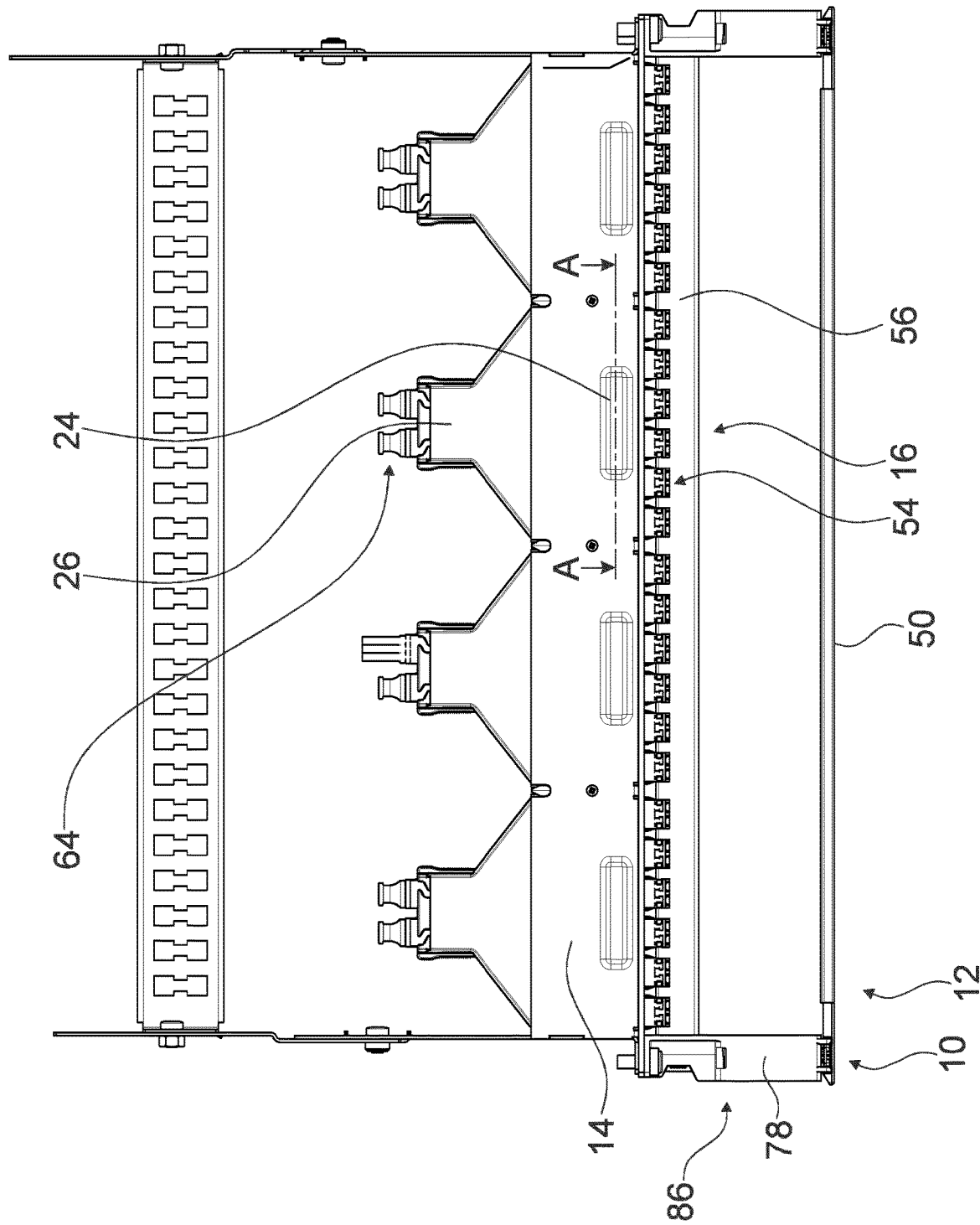
Figure 3:
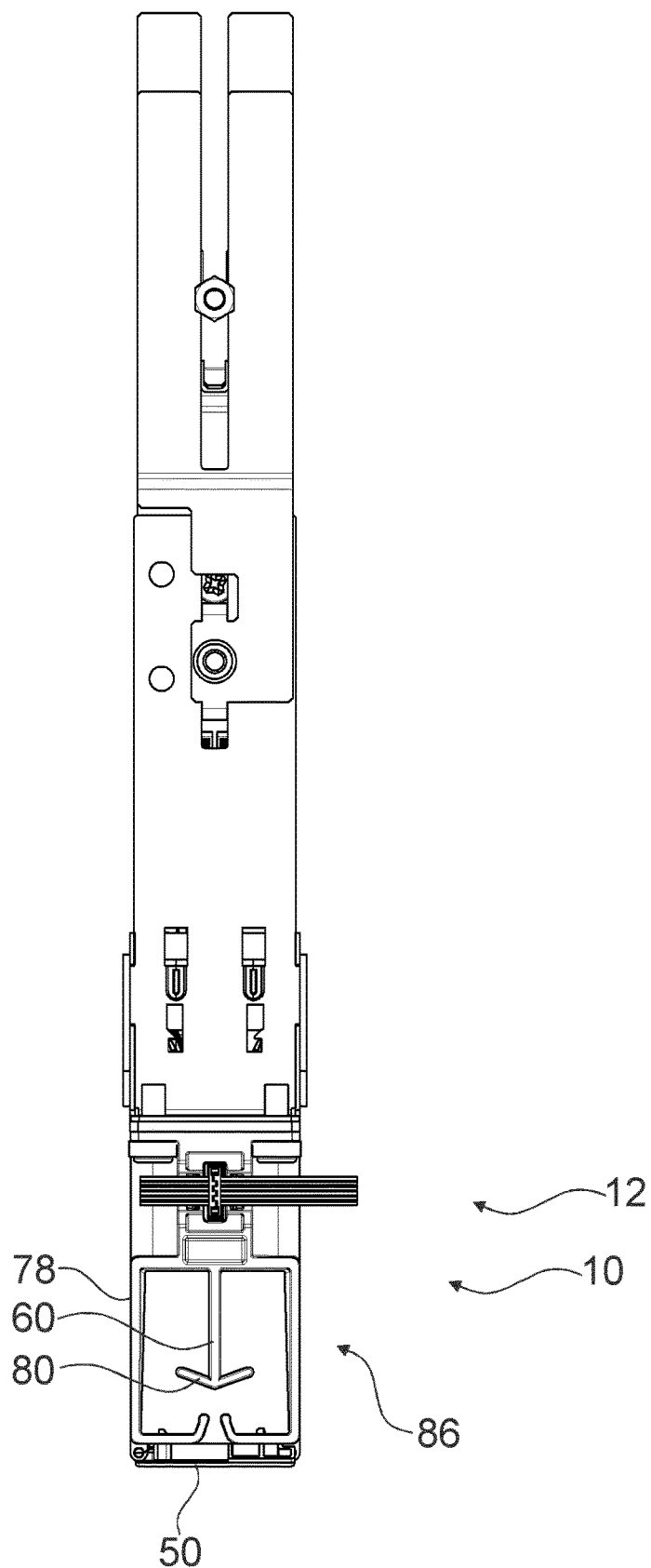
Figure 4:
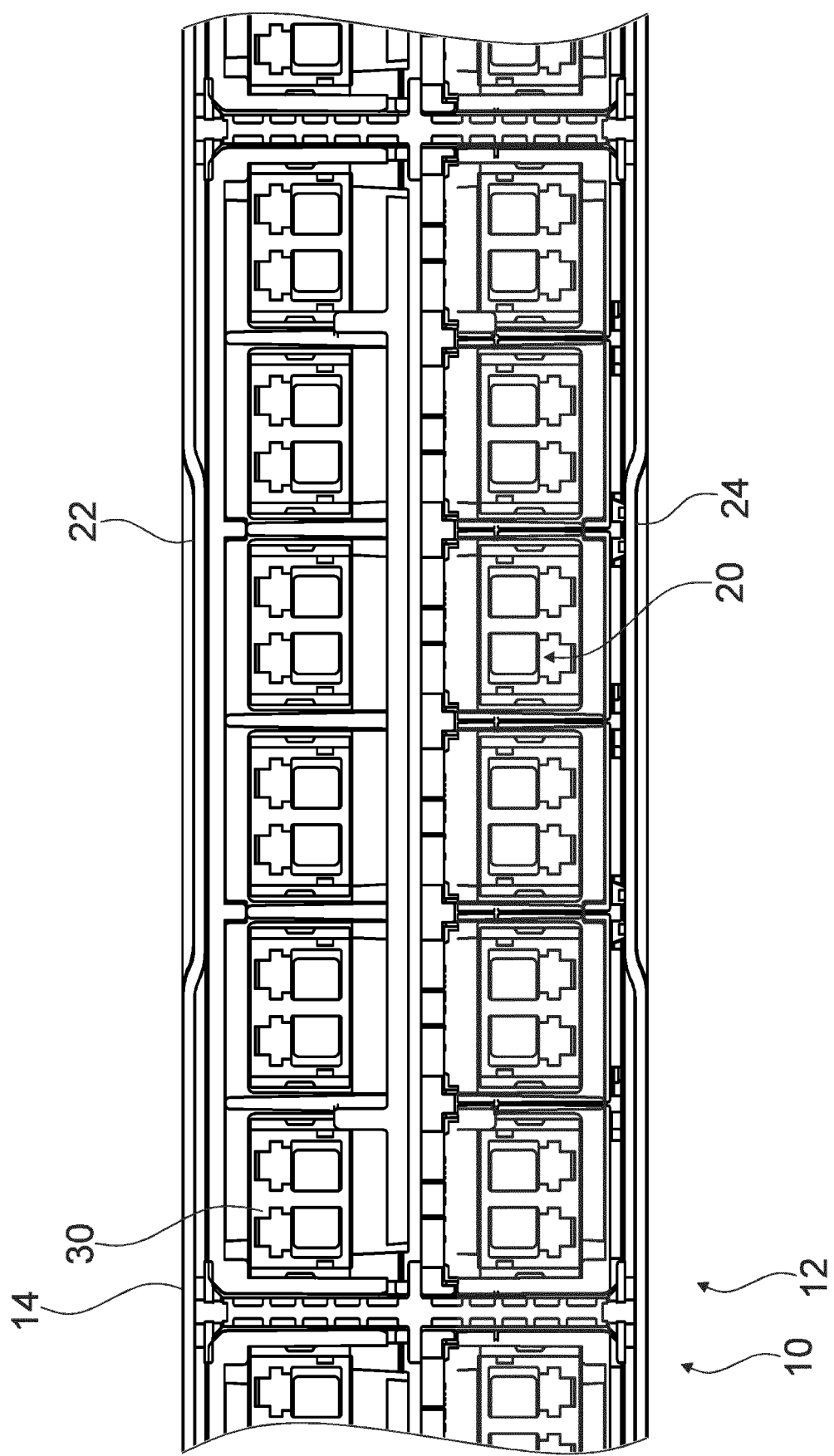
Figure 5:
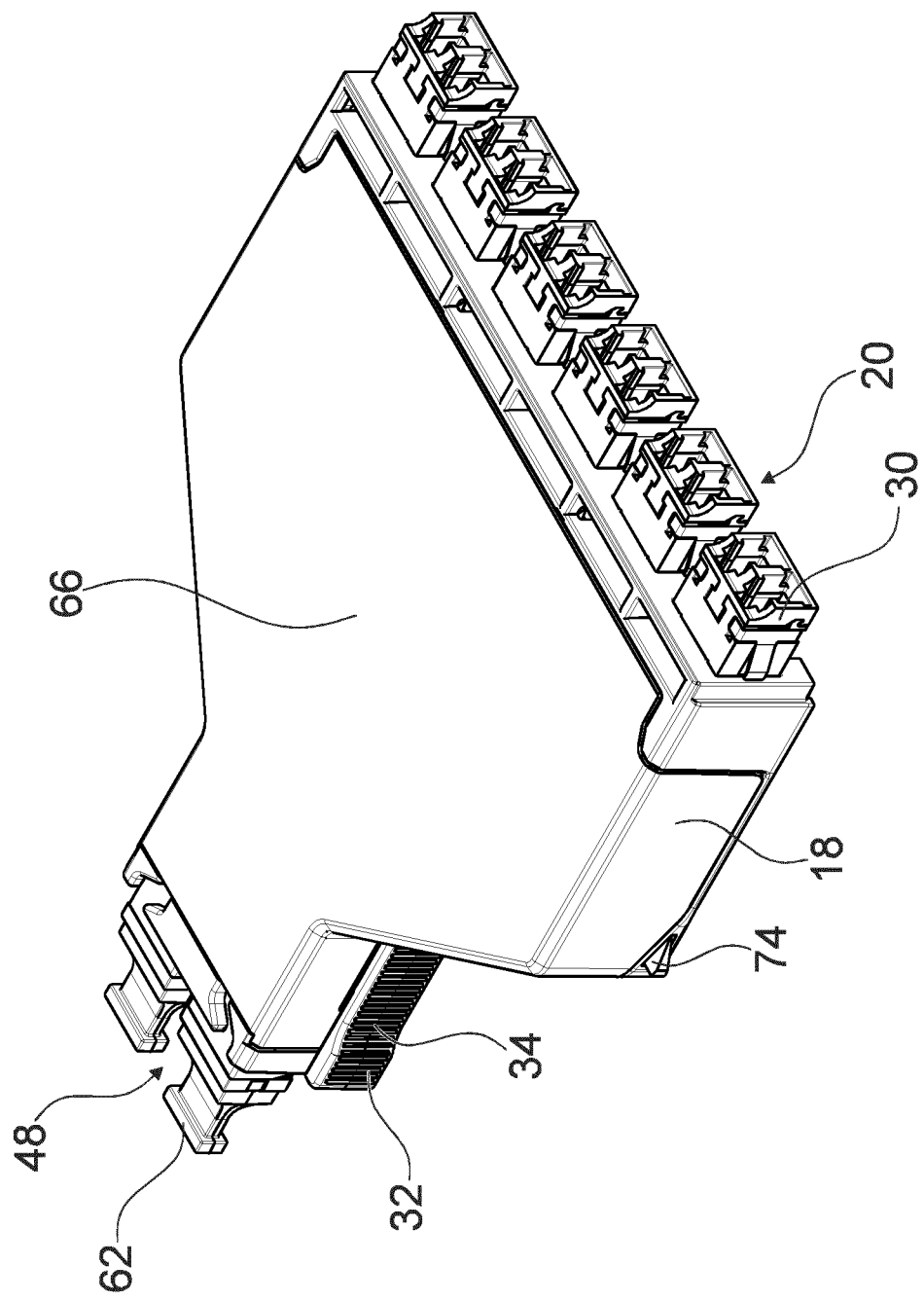
Figure 6:
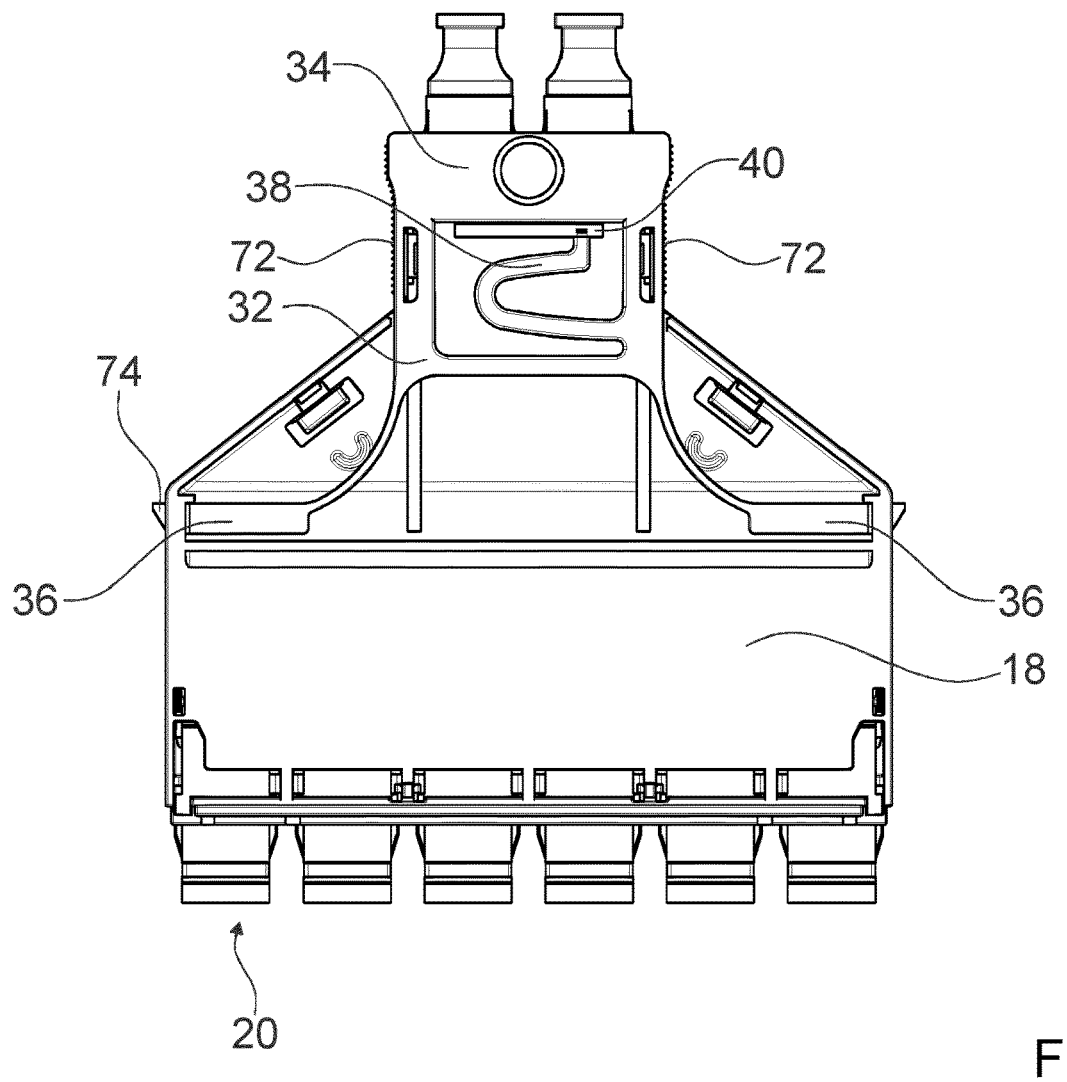
Figure 7:
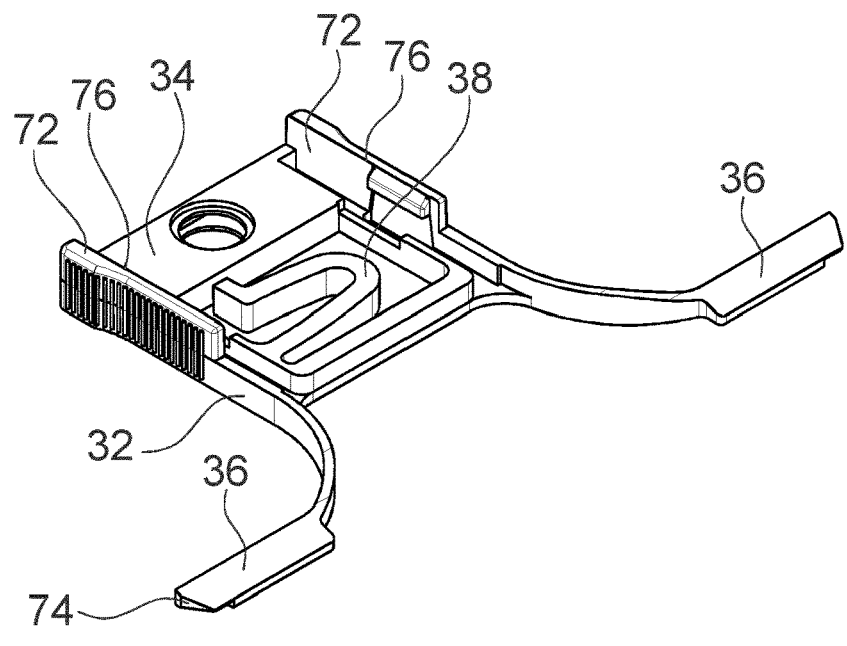
Figure 8:
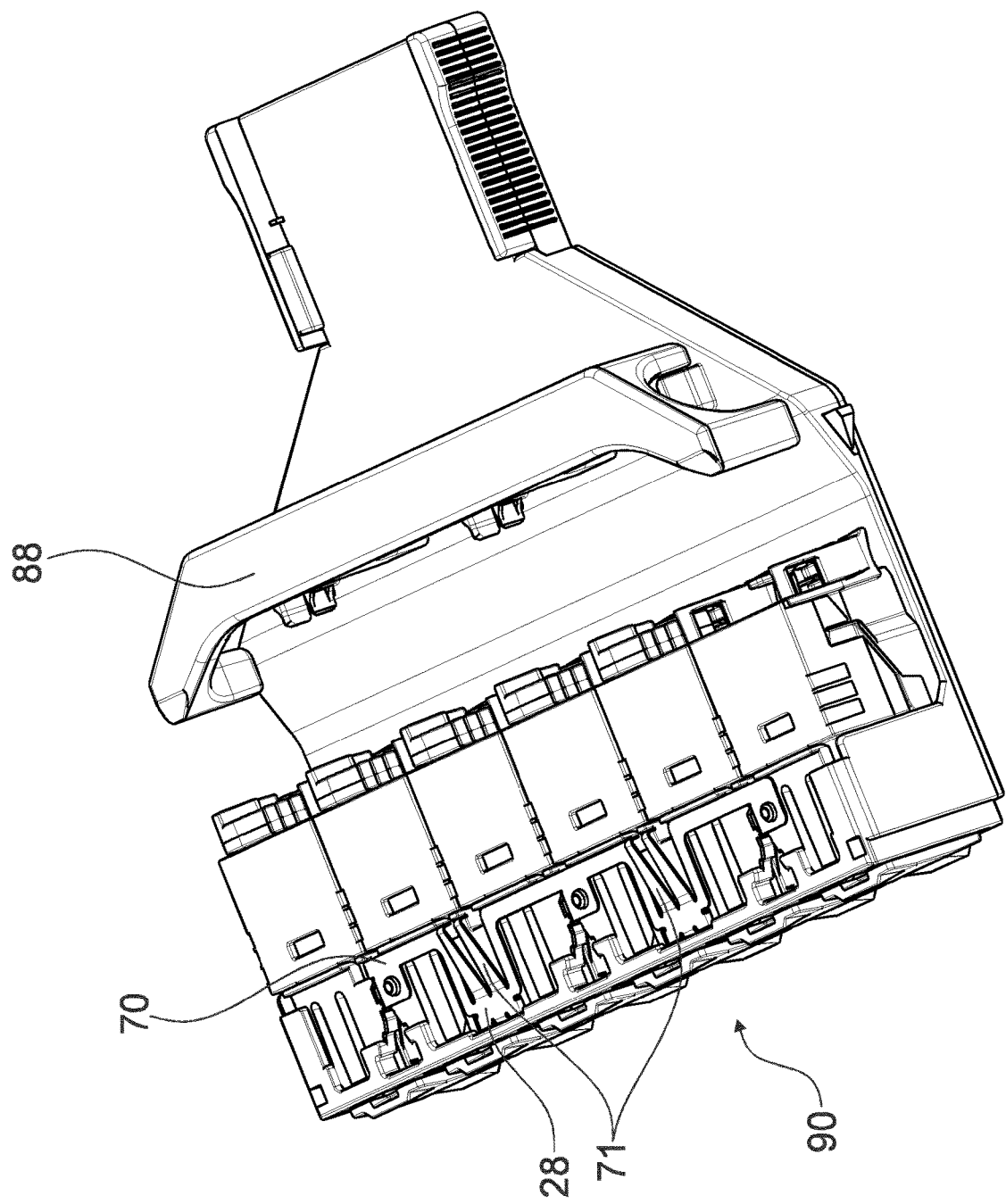

It is shown in:

FIG. 1 a cable management unit of a cable management system in a perspective view, FIG. 2 the cable management unit in a bottom view, FIG. 3 the cable management unit in a side view, FIG. 4 a sectional view of the cable management unit along the section A-A in FIG. 2, FIG. 5 a cassette of the cable management system in a perspective view, FIG. 6 the cassette in a bottom view, FIG. 7 a coupling element of the cassette, FIG. 8 an additional cassette of the cable management system and FIG. 9 a further cable management unit of the cable management system.

DESCRIPTION OF THE EXEMPLARY EMBODIMENT

FIGS. 1 to 4 show a cable management unit 12 for managing cables (not shown). While FIG. 4 shows a sectional view, because of the complexity of the cable management unit 12 an indication of cut surfaces by hatching has been forgone for the sake of visibility. The cable management unit 12 is part of a cable management system 10. The cable management unit 12 is embodied as a 19-inch insert. The cable management system 10 comprises a rack (not shown), which is embodied as a 19-inch standard rack. The cable management unit 12 is connected to the rack. Alternatively, the cable management unit 12 and the rack may be of any other commonly found proportions. The cable management unit 12 has a straight shape. The cable management unit 12 comprises a casing unit 14. The casing unit 14 defines a receiving space 16. The receiving space 16 comprises eight openings of the casing unit 14. The openings are arranged in two rows placed on top of each other, each row comprising four openings. Alternatively, the receiving space 16 may comprise any other number of openings or any other kinds of arrangements of the openings.

The cable management system 10 comprises a cassette 18, which is more closely shown in FIGS. 5 and 6. The cable management system 10 comprises seven further cassettes 26. While the cassettes 18, 26 could differ from each other, in this example the cassettes 18, 26 are embodied identically, which is why only the cassette 18 and one of the further cassettes 26 will be mentioned in the following description, the same applies to all other further cassettes 26 as well. The cassette 18 and the further cassette 26 are configured for managing optical connections. Alternatively, the cassette 18 and the further cassette 26 may be configured for managing electrical connections. The cassette 18 and the further cassette 26 are interchangeably mountable to the cable management unit 12.

The receiving space 16 receives the cassette 18 and the further cassette 26. The further cassette 26 is arranged below the cassette 16. The receiving space 16 receives the cassette 18 and the further cassette 26 in an upside-down orientation relative to each other. The casing unit 14 encompasses a front of the cassette 18 and the further cassette 26. The cassette 18 comprises a front socket section 20. The front socket section 20 is pushed through an opening of the receiving space 16 in order to allow access to sockets 30 of the front socket section 20 from the front of the cable management system 10. The front socket section 20 comprises six sockets 30. The cassette 18 comprises a rear socket section 48. The front socket section 20 is wider than the rear socket section 48. The rear socket section 48 comprises two rear sockets 62. A case 66 of the cassette 18 is tapered towards the rear socket section 48. The case 66 comprises two straight sections. The straight sections lead to the front socket section 20 and the rear socket section 48 respectively. The case 66 comprises a slanted section. The slanted section connects the two straight sections with each other. The further cassette 26 comprises a further front socket section 54 and a further rear socket section 64.

The casing unit 14 comprises a grounding element 22. The grounding element 22 is embodied as a deepening of the casing unit 14. Alternatively, the grounding element 22 may be embodied as a flat subarea of the casing unit 14. The grounding element 22 has a rectangular shape with rounded corners. The grounding element 22 corresponds to a section of the receiving space 16 which receives the cassette 18. In case the cassette 18 is embodied as a cassette configured for managing electrical connections, the grounding element 22 mechanically contacts and electronically grounds the cassette 18. The casing unit 14 comprises a further grounding element 24. The further grounding element 24 is embodied identically to the grounding element 22. The further grounding element 24 is arranged opposite the grounding element 22. The further grounding element 24 corresponds to a section of the receiving space 16 which receives the further cassette 26. In case the further cassette 26 is embodied as a cassette configured for managing electrical connections, the further grounding element 24 mechanically contacts and electronically grounds the cassette 26. The casing unit 14 comprises eight grounding elements 22, 24. The grounding elements 22, 24 are arranged in opposite-situated pairs. Each of the grounding elements 22, 24 is centered relative to their corresponding section of the receiving space 16.

The cassette 18 comprises a coupling element 32 which is shown more closely in FIG. 7. The coupling element 32 comprises a grip section 34 for gripping the cassette 18. The grip section 34 comprises two gripping parts 72. The gripping parts 72 are arranged on opposing sides of a rear of the cassette 18. The gripping parts 72 have a plate-like shape. The gripping parts 72 have a ribbed surface. The coupling element 32 comprises a latching section 36. The latching section 36 couples the cassette 18 to the cable management unit 12. The coupling element 32 is coupled to the cable management unit 12 via a snap connection. The latching section 36 comprises two latch noses 74. The latch noses 74 each engage in latch holes (not shown) of the cable management unit 12.

The coupling element 32 is embodied in a one-piece implementation. The coupling element 32 is made of plastic. The coupling element 32 is injection-molded. Alternatively, the coupling element 32 could be made of metal and formed in one piece. The latching section 36 can be actuated via the grip section 34. The grip section 34 allows a coupled movement with the latching section 36. Top parts 76 of the gripping parts 72 can be bent inwards in order to release the latch noses 74 from the latch holes.

The coupling element 32 comprises a spring section 38. The spring section 38 couples the coupling element 32 to a remaining portion of the cassette 18. The spring section 38 is movable from a rest position to a tensioned position and vice versa. The spring section 38 has a flat meandering shape. The cassette 18 comprises a receiving section 40 for partially receiving the spring section 38 in the rest position of the spring section 38. A coupling of the coupling element 32 to the cassette 18 comprises a moving of the spring section 38 to the tensioned position followed by a positioning of the coupling element 32 at a bottom of the remaining portion of the cassette 18 and a release of the spring section 38, which is then received by the receiving section 40.

The cable management system 10 comprises a door 50. The door 50 shields the front socket section 20. The door 50 is embodied as an elongate plate. The cable management system 10 comprises a front cable manager 86. The front cable manager 86 manages cables (not shown) leading to the front socket section 20. The front cable manager 86 comprises two arms 78. The arms 78 are arranged on opposing sides of the cable management unit 12. The door 50 is held between the arms 78. The door 50 is movable coupled to the arms 78. The arms 78 define a swivel range of the door 50. The door 50 may be opened and/or closed by moving the door 50 along the swivel range. The cable management system 10 may also comprise further arms for holding the door 50. The door 50 comprises a reinforcement element 52. The reinforcement element 52 prevents a bending of the door 50 due to a weight and/or a rigidity of the cables. The reinforcement element 52 is embodied as an elongate steel plate. The reinforcement element 52 is part of a frame of the door 50.

The cable management system 12 comprises an identification bar 56. The identification bar 56 is located in a vicinity of the receiving space 16. The identification bar 56 is located in a plane between the cassette 18 and the further cassette 26. The identification bar 56 is located between two openings of the receiving space 16. The identification bar 56 identifies plugs (not shown) plugged into the front socket section 20 and the further front socket section 54.

The identification bar 56 is detachable from the cable management unit 12. The identification bar 56 is clipped on the cable management unit 12. Alternatively, the identification bar 56 may be screwed on the cable management unit 12. The identification bar 56 comprises sensor elements (not shown). The sensor elements are positioned on a top and a bottom of the identification bar 56. The sensor elements identify the plugs by communicating with corresponding transmitters of the plugs. The sensor elements are embodied as RFID receivers. The sensor elements on the top of the identification bar 56 identify plugs plugged into the front socket section 20. The sensor elements on the bottom of the identification bar 56 identify plugs plugged into the further front socket section 54.

The front cable manager 86 comprises two cable holding elements 60, which are identical to each other, which is why in the following only one of the cable holding elements 60 is described. The cable holding element 60 holds the cables leading to the front socket section 20. The cable holding element 60 comprises two tines 80. The tines 80 are each configured to catch and hold cables leading to the cassette 18 and the further cassette 26 received in one row of the two rows of openings. The tines 80 have an angled orientation. The cable holding element 60 has an arrow shape. The cable holding element 60 forms a portion of one of the arms 78.

FIG. 8 shows an additional cassette 88 of the cable management system 10. The additional cassette 88 is configured for managing electrical connections. The receiving space 16 is configured for receiving the additional cassette 88. The additional cassette 88 comprises an additional front socket section 90. The additional cassette 88 comprises a contact element 28. The contact element 28 mechanically and electrically connects the grounding element 22 with each socket of the additional front socket section 90. The contact element 28 is embodied as a bent metal sheet, alternatively the contact element 28 could be embodied as a wire connection. The contact element 28 comprises a base 70. The contact element comprises contacts 71. The contacts 71 are embodied as spring contacts. The base 70 leads to the contacts 71. The contacts 71 mechanically and electrically connect the base 70 to one of the grounding elements 22, 24 that corresponds to the section of the receiving space 16 in which the additional cassette 88 is inserted. In the case wherein the cassette 18 and/or the further cassette 26 are also configured for managing electrical connections, they may be embodied identical to the additional cassette 88.

FIG. 9 shows a further cable management unit 42 of the cable management system 10. The further cable management unit 42 is largely identical to the cable management unit 12, which is why in the following only differences between the two are described. A further casing unit 44 defines a further receiving space 46 for receiving the cassette 18 and the further cassette 26. The further cable management unit 42 has an angled shape.

The cable management system 10 comprises a labeling bar 58. The labeling bar 58 labels the front socket section 20 and the further front socket section 54. The labeling bar 58 comprises a display (not shown) for displaying a label of the front socket section 20 and a further label of the further front socket section 54. The display is embodied as an LCD display, alternatively, any other commonly known type of displays may be used. The identification bar 56 and the labeling bar 58 are interchangeably mountable to the cable management unit 12 and the further cable management unit 42. The labeling bar 58 is clipped on the further cable management unit 42. The labeling bar 58 comprises two labeling elements 82. The labeling elements 82 are held, by a middle piece 84, at an angle that is identical to the angle between parts of the further cable management unit 42. The labeling bar 58 may be substituted by a further identification bar (not shown), which analogously to the labeling bar 58 comprises two identification parts and may be held by the middle piece 84 in the same way.

REFERENCE NUMERALS 10 cable management system
12 cable management unit
14 casing unit
16 receiving space
18 cassette
20 front socket section
22 grounding element
24 further grounding element
26 further cassette
28 contact element
30 socket
32 coupling element
34 grip section
36 latching section
38 spring section
40 receiving section
42 further cable management unit
44 further casing unit
46 further receiving space
48 rear socket section
50 door
52 reinforcement element
54 further front socket section
56 identification bar
58 labeling bar
60 cable holding element
62 rear socket
64 further rear socket section
66 case
70 base
71 contact
72 gripping part
74 latch nose
76 top part
78 arm
80 tine
82 labeling part
84 middle piece
86 front cable manager
88 additional cassette
90 additional front socket section

The invention claimed is:

1. A cable management system, comprising: a cable management unit which has a casing unit defining at least one receiving space for receiving a cassette; and comprising the cassette which has a front socket section, wherein the casing unit comprises a grounding element that is configured for mechanically contacting and electrically grounding the front socket section in a mounted state of the cassette, wherein the grounding element is configured as a deepening of the casing unit that extends into the at least one receiving space.

2. The cable management system according to claim 1, wherein the casing unit comprises a further grounding element, which is arranged opposite the grounding element and is configured for mechanically contacting and electrically grounding a further cassette.

3. The cable management system according to claim 1, wherein the cassette comprises a contact element that is configured for mechanically and electrically connecting the grounding element with each socket of the front socket section in the mounted state of the cassette.

4. The cable management system according to claim 1, wherein the cassette comprises a coupling element, which has a grip section for gripping the cassette and a latching section for coupling the cassette to the cable management unit, wherein the coupling element is embodied in a one-piece implementation.

5. The cable management system according to claim 4, wherein the coupling element is made of plastic.

6. The cable management system according to claim 4, wherein the latching section can be actuated via the grip section.

7. The cable management system according to claim 6, wherein the grip section is configured for a coupled movement with the latching section.

8. The cable management system according to claim 1, wherein the coupling element comprises a spring section for coupling the coupling element to a remaining portion of the cassette, wherein the cassette comprises a receiving section for partially receiving the spring section in a rest position of the spring section.

9. The cable management system according to claim 1, the cable management system comprising a further cable management unit, which has a further casing unit defining at least one further receiving space for receiving the cassette, wherein the cable management unit has a straight shape, the further cable management unit has an angled shape, and the cassette has a rear socket section.

10. The cable management system according to claim 9, wherein the front socket section is wider than the rear socket section.

11. The cable management system according to claim 1, the cable management system comprising a door for shielding the front socket section, wherein the door comprises a reinforcement element that is configured for preventing a bending of the door due to a weight and/or a rigidity of cables leading to the front socket section in a working state.

12. The cable management system according to claim 1, the cable management system comprising a further cassette with a further front socket section, wherein the receiving space is configured for receiving the cassette and the further cassette in an upside-down orientation relative to each other.

13. The cable management system according to claim 12, wherein the cassette and the further cassette may each be configured for managing electrical and/or optical connections, wherein the cassette and the further cassette are interchangeably mountable to the cable management unit.

14. The cable management system according to claim 1, the cable management system comprising an identification bar that is located in a vicinity of the receiving space and is configured for identifying plugs plugged into the front socket section in a working state.

15. The cable management system according to claim 12, the cable management system comprising an identification bar that is located in a vicinity of the receiving space and is configured for identifying plugs plugged into the front socket section in a working state, wherein the identification bar is located in a plane between the cassette and the further cassette in at least one working state.

16. The cable management system according to claim 14, wherein the identification bar is detachable from the cable management unit.

17. The cable management system according to claim 16, the cable management system comprising a labeling bar for a labeling of the front socket section, wherein the identification bar and the labeling bar are interchangeably mountable to the cable management unit.

18. The cable management system according to claim 14, wherein the identification bar comprises sensor elements which are positioned on a top and a bottom of the identification bar.

19. The cable management system according to claim 1, the cable management system comprising a front cable manager for managing cables leading to the front socket section, comprising a cable holding element for a holding of cables leading to the front socket section.

20. A cable management system, comprising; a cable management unit which has a casing unit defining at least one receiving space for receiving a cassette; and comprising the cassette which has a front socket section, wherein the cassette comprises a coupling element, which has a grip section for gripping the cassette and a latching section for coupling the cassette to the cable management unit, wherein the coupling element is embodied in a one-piece implementation, wherein the coupling element includes a spring section for coupling the coupling element to a remaining portion of the cassette, wherein the cassette comprises a receiving section for partially receiving the spring section in a rest position of the spring section.

\* \* \* \* \*